US008993418B2

(12) United States Patent
Destefanis et al.

(10) Patent No.: US 8,993,418 B2
(45) Date of Patent: Mar. 31, 2015

(54) SHALLOW HEAVILY DOPED SEMICONDUCTOR LAYER BY CYCLIC SELECTIVE EPITAXIAL DEPOSITION PROCESS

(75) Inventors: Vincent Destefanis, Saint-Egrève (FR); Nicolas Loubet, Guilderland, NY (US)

(73) Assignees: Commissariat a l'Energie Atomique et aux Energies Alternatives, Paris (FR); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/988,436

(22) PCT Filed: Nov. 19, 2010

(86) PCT No.: PCT/US2010/057441
§ 371 (c)(1),
(2), (4) Date: Sep. 5, 2013

(87) PCT Pub. No.: WO2012/067625
PCT Pub. Date: May 24, 2012

(65) Prior Publication Data
US 2014/0024203 A1  Jan. 23, 2014

(51) Int. Cl.
*H01L 21/20* (2006.01)
*H01G 9/20* (2006.01)
*H01L 21/02* (2006.01)
(52) U.S. Cl.
CPC ...... *H01L 21/0226* (2013.01); *H01L 21/02499* (2013.01); *H01L 21/02532* (2013.01); *H01L 21/02573* (2013.01); *H01L 21/0262* (2013.01); *H01L 21/02642* (2013.01)
USPC ........... 438/478; 438/479; 438/481; 438/492; 438/497; 438/506

(58) Field of Classification Search
CPC ............ H01L 27/1203; H01L 21/2018; H01L 21/02636
USPC ......... 438/478–481, 492, 497, 502, 503, 506, 438/522; 257/347
See application file for complete search history.

(56) References Cited

U.S. PATENT DOCUMENTS

| 5,399,206 | A | 3/1995 | de Lyon |
| 5,888,588 | A | 3/1999 | Nagabushnam et al. |
| 2005/0079692 | A1* | 4/2005 | Samoilov et al. ............. 438/481 |

(Continued)

OTHER PUBLICATIONS

International Search Report issued in International Application No. PCT/US2010/057441 dated Jan. 25, 2011.
Written Opinion of the International Searching Authority issued in International Application No. PCT/US2010/057441 dated Jan. 25, 2011.
Tillack, B., et al., "Atomic Layer Doping for Future Si Based Devices," ECS Transactions, vol. 22, pp. 121-131, 2009.
Ohring, Milton, "Materials Science of Thin Films," p. 480, 2002.
Murota, Junichi, et al., "Atomically controlled CVD Processing for Future Si Based Devices," Solid-State and Integrated-Circuit Technology, pp. 1312-1315, 2008.

(Continued)

Primary Examiner — Hsien Ming Lee
(74) Attorney, Agent, or Firm — Oliff PLC

(57) ABSTRACT

The deposition method comprises providing a substrate with a first mono-crystalline zone made of a semiconductor material and a second zone made of an insulating material. During a passivation step, a passivation atmosphere is applied on the substrate so as to cover the first zone with doping impurities. During a deposition step, gaseous silicon and/or germanium precursors are introduced and a doped semiconductor film is formed. The semiconductor film is mono-crystalline over the first zone and has a different texture over the second zone. During an etching step, a chloride gaseous precursor is applied on the substrate so as to remove the semiconductor layer over the second zone.

17 Claims, 1 Drawing Sheet

(56) References Cited

U.S. PATENT DOCUMENTS

| | | |
|---|---|---|
| 2006/0057859 A1* | 3/2006 | Chen .............................. 438/765 |
| 2006/0121699 A1 | 6/2006 | Blomiley et al. |
| 2007/0023081 A1 | 2/2007 | Johnson et al. |
| 2007/0207596 A1 | 9/2007 | Kim et al. |

OTHER PUBLICATIONS

Jan. 19, 2015 Extended European Search Report issued in European Patent Application No. 10859767.5.

* cited by examiner

SHALLOW HEAVILY DOPED SEMICONDUCTOR LAYER BY CYCLIC SELECTIVE EPITAXIAL DEPOSITION PROCESS

BACKGROUND OF THE INVENTION

The invention relates to a method for manufacturing a doped mono-crystalline semiconductor layer on a substrate.

STATE OF THE ART

Modern integrated circuits typically comprise a great number of circuit elements on a given chip area. Various elements, such as transistors, are positioned and connected to each other according to a specified circuit layout. The continuing shrinkage of transistors dimensions involves a plurality of issues to be addressed. Carrier concentration in source and drain regions is one of the key parameters of the MOS device and reduction of parasitic resistance is a primary challenge.

Source and drain regions are conventionally realized by means of ionic implantation. A desired impurity material is ionized in an ion source, the ions are accelerated to form an ion beam of prescribed energy, and the ion beam is directed at the surface of a semiconductor wafer. Energetic ions in the beam penetrate into the bulk of the semiconductor material and are embedded into the crystalline lattice of the semiconductor material to form a region of desired conductivity. During ionic implantation, the semiconductor material is amorphized and an activation and curing anneal has to be performed.

On one hand, a very high temperature anneal has to be performed to increase the concentration of active dopant into the semiconductor lattice, but on the other hand the annealing temperature has to be limited and/or the annealing duration has to be reduced to limit dopant diffusion. Thus it is a great difficulty to achieve a semiconductor film exhibiting a high dopant concentration with a sharp profile.

Selective epitaxial growth is also implemented as an alternative technology. During selective epitaxial growth, a silicon and/or germanium film is deposited only at selective locations where silicon substrate is exposed. With epitaxial growth, a monocrystalline layer is formed over monocrystalline substrate and the lattice is continued by the new semiconductor film. During selective epitaxial growth, no deposition takes place over nitride and oxide zones.

In-situ doped silicon and silicon-germanium alloys received also much interest over the last few years as a method to reduce external transistor resistance and contact resistance. Conventionally, in-situ doped silicon and silicon-germanium alloys with low dopant concentration have been demonstrated, principally in the bipolar area with fully self-align structures. Growth atmosphere during selective epitaxial growth comprises chlorine, silicon and dopant based gaseous chemistries in order to form a layer of doped semiconductor material.

For integrating doped selective epitaxial growth into a CMOS process flow, a higher concentration of dopant has to be incorporated. The deposited material must remain monocrystalline and selective against silicon dioxide and against silicon nitride which are present at the surface of most CMOS circuits. Faceting issue also has to be taken into account in order to reduce integration difficulties.

OBJECT OF THE INVENTION

One object of the invention is to provide a selective deposition method that is easy to implement and that enables high active dopant concentration to be achieved.

The method according to the invention is characterized by the appended claims and more particularly by the fact that it comprises:
A) providing a substrate having a face comprising a first zone of mono-crystalline semiconductor material and a second zone of insulating material,
B) submitting the substrate to a doping atmosphere comprising gaseous dopant precursors and devoid of gaseous silicon or germanium precursors,
C) submitting the substrate to a deposition atmosphere comprising gaseous silicon or germanium precursors under conditions causing depositing of a semiconductor layer with a mono-crystalline portion over the first zone and a portion having a different texture over the second zone,
D) submitting the substrate to an etching atmosphere comprising a gaseous chloride precursor for removing the semiconductor layer over the second zone and leaving the mono-crystalline portion over the first zone.

BRIEF DESCRIPTION OF THE DRAWINGS

Other advantages and features will become more clearly apparent from the following description of a particular embodiment of the invention given for non-restrictive example purposes only and represented in the accompanying drawings in which FIGS. 1 to 4 schematically represent, in cross-section, the successive steps of a particular embodiment of a cyclic selective deposition method.

DESCRIPTION OF A PREFERRED EMBODIMENT OF THE INVENTION

Figure 1:
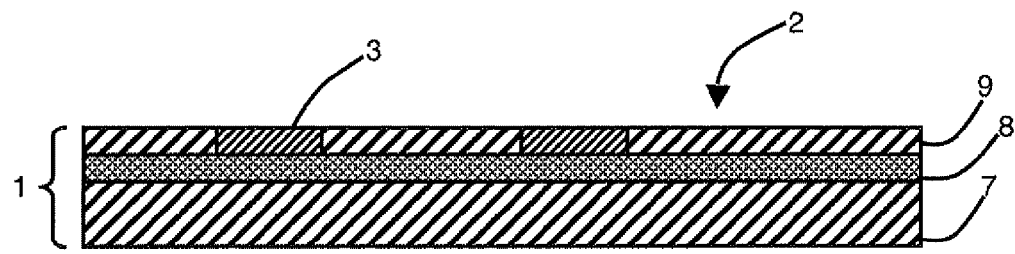

As illustrated in FIG. 1, the deposition process is performed on a substrate 1 comprising a first zone 2 made of a mono-crystalline semiconductor material and a second zone 3 made of an insulating material. The mono-crystalline material is for example silicon, germanium or a silicon-germanium alloy. The insulating material is for example silicon oxide, silicon nitride, hafnium oxide or a material used as a gate dielectric.

First 2 and second 3 zones are adjacent and are formed on a face of the substrate. The first zone 2 of the substrate 1 can be an intrinsic or a doped semiconductor material. The substrate 1 is for example a semiconductor on insulator substrate or a bulk substrate. First zone 2 can be a source and/or a drain region of MOSFET device. Second zone 3 can be an insulating element, such as a lateral spacer or an insulating trench.

The substrate 1 is introduced into a processing chamber. The processing chamber controls the temperature and the pressure all around the substrate 1. The processing chamber is for example a Rapid Thermal Chemical Vapor Deposition chamber (RTCVD), a Low Pressure Chemical Vapor Deposition chamber (LPCVD), an Atmospheric Pressure Chemical Vapor Deposition chamber (APCVD) or a Plasma Enhanced Chemical Vapor Deposition chamber (PECVD).

Before initiating the deposition process, if a parasitic layer is formed over the first zone 2, such as an oxidized surface, the parasitic layer is removed. If the first zone 2 is made of silicon or silicon-germanium alloy, a thin silicon oxide layer can be present over the first zone. This parasitic layer is removed, in conventional manner, for example by means of a wet etching with a hydrofluoric acid bath and/or by means of a thermal treatment under a hydrogen atmosphere.

Figure 2:
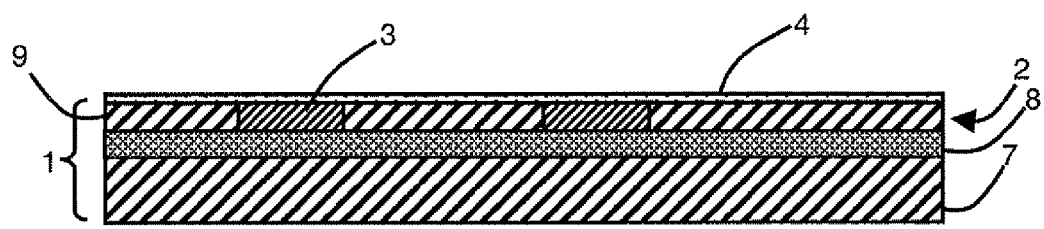

As illustrated in FIG. 2, the deposition process comprises a first step, a passivation step, wherein a passivation atmosphere, also called doping atmosphere, is injected into the processing chamber. The doping atmosphere comprises gaseous dopant precursors such as advantageously boron, phosphorous and arsenic precursors. For example, diborane ($B_2H_6$), phosphine ($PH_3$) or arsine ($AsH_3$) can be used in the doping atmosphere. The substrate is submitted to the doping atmosphere comprising gaseous dopant precursors and devoid of gaseous silicon or germanium precursors. The doping atmosphere is also devoid of oxygen precursor.

The doping atmosphere realizes passivation of the face of the substrate 1. Dopant precursors are present on the surface of the substrate 1, i.e dopant precursors are present on the surface of the first and second zones. During application of the doping atmosphere, dopants (for example B, As or Ph) stick over the first and second zones and realize passivation of the surface.

At the end of the passivation step, doping impurities cover, at least partially, the face of the substrate 1. Up to one monolayer of doping impurities is present on the surface of the substrate 1. A continuous or discontinuous passivation layer 4 is formed during passivation step.

In a preferred embodiment, a vector gas such as hydrogen, nitrogen, argon or helium is used to better control flux of precursors inside the chamber. The vector gas is an inert gas, i.e. a gas that does not react with the first 2 and the second 3 zones under the operating conditions. Dopant precursor can be pure or diluted into an additional gas. The additional gas is for example hydrogen, argon, helium (and nitrogen according to operating conditions). Additional gas is not an active gas, i.e. a gas which is able to react with the substrate 1 such as to perform deposition of a semiconductor layer or growth of new material like an insulation material (oxide, nitride . . . ) or a conducting material (metal, silicide . . . ). In a preferred embodiment, the doping atmosphere is constituted by a dopant precursor and a vector gas.

The doping atmosphere is devoid of gaseous deposition precursors in order to avoid depositing a layer of semiconductor material or avoid forming an oxide or a nitride on the first zone 2. Advantageously, the doping atmosphere is devoid of chlorine-based gaseous precursors in order to avoid etching of silicon and/or germanium atoms of the substrate 1. Chlorine-based gaseous precursor is also expected to limit bonding capability of doping molecules on the surface.

The passivation step is preferentially performed with a temperature comprised between 400° C. and 800° C., advantageously with a temperature comprised between 500° C. and 650° C.

The passivation step is preferentially performed with a pressure range comprised between several Torr and several hundreds of Torr (up to atmospheric pressure). Advantageously, the passivation step is performed with pressure larger than 100 Torr.

Duration of the passivation step depends on temperature, on partial pressure of the doping molecules in the chamber and on nature of the molecules. Advantageously, increasing the partial pressure of dopants and/or increasing the temperature will decrease duration.

Figure 3:
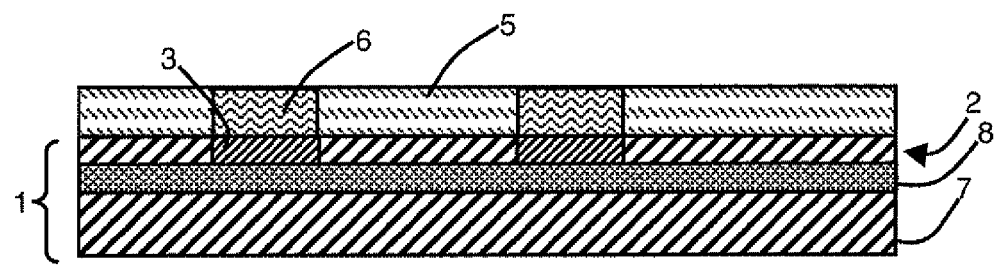

After passivation step, a second step, called deposition step, is performed in the chamber, as illustrated in FIG. 3. The deposition step is realized with a deposition atmosphere. The deposition atmosphere comprises deposition precursors such as gaseous silicon and/or germanium precursors. For example silane, germane, dichlorosilane, trichlorosilane, disilane can be used in the deposition atmosphere. Silicon and/or germanium precursors can be hydride precursors (silane, germane . . . ) or chloride precursors (dichlorosilane, trichlorosilane . . . ) or a mix of hydride and chloride precursors.

In a preferred embodiment, the deposition atmosphere comprises a vector gas for example hydrogen, nitrogen.

The deposition atmosphere can also comprise an additional gaseous precursor such as a carbon precursor. The carbon precursor is for example monomethylsilane, dimethylsilane or trimethylsilane.

The deposition atmosphere can also comprise an additional gaseous precursor such as a chlorine precursor. The chlorine precursor is for example gaseous hydrochloric acid or dichlorine gas. In another embodiment, the doping atmosphere is devoid of chlorine-based gaseous precursors.

During the deposition step, a semiconductor layer is deposited on the substrate. A first mono-crystalline semiconductor portion 5 is deposited over the first zone 2. A second portion 6 with a different texture is deposited over the second zone 3. According to the operating conditions and the thickness over the second zone 3, the second portion 6 of the film is polycrystalline and/or amorphous. In a preferred embodiment, the second portion 6 is made by an amorphous material. During deposition step, a semiconductor layer with a first mono-crystalline portion and a second portion with a different texture is deposited.

The deposition step is preferentially performed with a temperature comprised between 400° C. and 800° C., advantageously with a temperature comprised between 500° C. and 650° C. The deposition temperature depends on the constituents of the depositing atmosphere and depends on the thickness to be deposited.

The deposition step is preferentially performed with a pressure range comprised between several Torr and several hundreds of Torr (up to atmospheric pressure). The deposition pressure depends on the constituents of the depositing atmosphere and depends on the thickness to be deposited.

Temperature and pressure of the deposition step are chosen so as to achieve growth of a predetermined thickness of mono-crystalline film over the first zone. During the growth of the first mono-crystalline film, the second film grows over the second zone with the same or a different thickness.

During epitaxial growth of the mono-crystalline film over the first zone, the passivation layer 4 made of doping impurities is at least partially incorporated into the semiconductor layer. Thus a doped semiconductor film is formed even if the deposition atmosphere does not comprise dopant precursors.

At the end of the deposition step, the first portion 5 of the semiconductor film has a thickness advantageously comprised between few nanometers and few tens of nanometers, more advantageously between 5 and 15 nm, preferentially equals to 10 nm. As thickness of the monocrystalline film 5 is lower than few tens of nanometer, the amount of doping impurities deposited on the surface allows a thin film of highly doped monocrystalline material to be obtained.

A part of doping impurities coming from the passivation layer 4 diffuses into the semiconductor film during its growth. As growth takes place within low temperature range, advantageously between 600-650° C., the diffusion phenomenon is reduced and majority of doping impurities is concentrated at the interface between the substrate 1 and the semiconductor film.

Concentration of doping impurities inside the semiconductor film depends on the amount of doping impurities stuck during the passivation step and on the thickness of the semiconductor layer.

In a preferred embodiment, the deposition atmosphere comprises gaseous dopant precursors. The same dopant precursors as the passivation atmosphere are injected to reduce desorption of doping atoms and to s achieve high doping concentration in the final layer. In a more preferred embodiment, in a first time, the deposition atmosphere is devoid of dopant precursors to realize deposition of a semiconductor layer without performing desorption of the doping atoms bonded on the surface of the substrate. Then a deposition atmosphere with dopant precursors can be used.

As deposition atmosphere is devoid of dopant precursors, semiconductor growth rate is not impacted by the partial pressure of dopant precursor. The deposition kinetic is more reliable. In a preferred embodiment, deposition atmosphere is devoid in dopant precursor.

Figure 4:
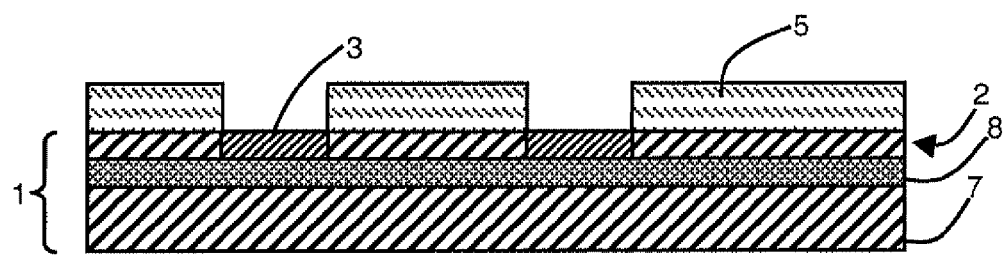

As illustrated in FIG. 4, the deposition step is followed by an etching step wherein an etching atmosphere is provided on the substrate. The etching atmosphere comprises a gaseous chlorinated precursor able to etch the semiconductor film. The etching atmosphere comprises or is constituted for example of gaseous hydrogen chloride (HCl) or chlorine ($Cl_2$). A vector gas made by an inert gas can be used during the etching step.

The operating conditions are chosen such as to obtain etching of the second portion 6 of the semiconductor film over the second zone 3 made of dielectric material.

According to the operating conditions and to the nature of first and second portions of the semiconductor film, the first mono-crystalline portion 5 can be partially etched during etching of the second portion 6 of the film.

As second portion 6 of the semiconductor film is removed, the deposition method forms a semiconductor film only over the first zone 2 of the substrate 1. The deposition method is assimilated to a selective epitaxial growth method.

As passivation step and deposition step are separated, it is possible to obtain much higher dopant concentration compared to conventional methods wherein doping and growing steps are performed simultaneously.

In a preferred embodiment, an additional thermal treatment is performed to activate and homogenize the doping impurities into the semiconductor film. As deposition is performed with a low thermal budget, the additional thermal treatment can increase the amount of active doping impurities compared to the amount as deposited. If diffusion of the passivation layer into the semiconductor film is incomplete, the diffusion anneal can homogenize dopant concentration along the semiconductor film.

The thermal treatment can be a rapid thermal treatment (RTA) in the range 900-1100° C., a spike anneal or a laser anneal in the range 1100-1300° C. The thermal treatment can also be a combination of the previous techniques.

The doping concentration in the semiconductor film is controlled by means of the amount of doping impurities deposited during the passivation step and by means of the thickness of semiconductor material deposited and etched.

If a thick and highly doped film is sought, the deposition method is repeated so as to form a cyclic method wherein passivation step, deposition step and etching step are performed in a repeating manner.

Thus a first semiconductor layer is deposited and etched as explained previously, then a second semiconductor layer is formed and etched. The second passivation step, the second deposition step and the second etching step are performed over the first semiconductor layer.

If necessary, a plurality of semiconductor layers can be formed, i.e. a plurality of cycles can be performed. A thermal treatment can be realized at each cycle. In a preferred manner, a thermal treatment is performed once at the end of the deposition method in order to reduce thermal budget of the deposition method.

In a preferred embodiment, passivation step, deposition step and etching step are performed successively in the same process chamber. In another embodiment, steps are performed in various process chambers.

In a preferred embodiment which can be combined with the previous embodiments, the substrate is a SOI substrate with a support 7, a buried dielectric 8 and an active semi-conducting layer 9. The buried dielectric 8 is disposed between the support 7 and the active semi-conducting layer 9 to avoid electrical contact.

The method can achieve high level of active doping concentration instead of performing ionic implantation leading to an amorphization of the entire height of the active semi-conducting layer 9.

The invention claimed is:

1. A method for manufacturing a doped mono-crystalline semiconductor layer on a substrate, the method comprising the following steps:
    A) providing a substrate having a face comprising a first zone of mono-crystalline semiconductor material and a second zone of insulating material;
    B) submitting the substrate to a doping atmosphere comprising gaseous dopant precursors and devoid of gaseous silicon or germanium precursors;
    C) submitting the substrate to a deposition atmosphere comprising gaseous silicon and/or germanium precursors under conditions causing depositing of a semiconductor layer with a mono-crystalline portion over the first zone and a portion having a different texture over the second zone; and
    D) submitting the substrate to an etching atmosphere comprising a gaseous chloride precursor for removing the semiconductor layer over the second zone and leaving the mono-crystalline portion over the first zone.

2. The method according to claim 1, further comprising performing, between steps C) and D), a thermal treatment under an inert atmosphere whereby doping impurities diffuse into the semiconductor layer.

3. The method according to claim 1, comprising performing steps B), C) and D) repeatedly.

4. The method according to claim 3, further comprising performing a thermal treatment under an inert atmosphere whereby doping impurities diffuse into the semiconductor layer, the thermal treatment being performed between steps C) and D) of a last occurrence.

5. The method according to claim 1, wherein:
    in step B), a passivation layer is formed over the first zone; and
    in step C), dopant atoms from the passivation layer diffuse into the mono-crystalline portion at an interface with the substrate.

6. The method according to claim 1, wherein the mono-crystalline material is made of silicon and/or germanium.

7. The method according to claim 1, wherein the deposition atmosphere is devoid of the gaseous dopant precursors.

8. The method according to claim 1, wherein before step D), the mono-crystalline portion has a thickness of less than a few tens of nanometers.

9. The method according to claim 8, wherein the thickness is between 5 and 15 nm.

10. A method for manufacturing a doped mono-crystalline semiconductor layer on a substrate, the method comprising the following steps:
    A) providing a substrate having a face comprising a first zone of mono-crystalline semiconductor material and a second zone of insulating material;
    B) submitting the substrate to a doping atmosphere comprising gaseous dopant precursors and devoid of gaseous silicon or germanium precursors so as to form a passivation layer over the first zone;

C) submitting the substrate to a deposition atmosphere comprising gaseous silicon and/or germanium precursors under conditions causing epitaxial growth of a semiconductor layer with a mono-crystalline portion over the first zone and a portion having a different texture over the second zone, whereby dopant atoms from the passivation layer are incorporated into the semiconductor layer during the epitaxial growth of the semiconductor layer, thereby removing at least part of the passivation layer and forming a doped semiconductor layer; and D) submitting the substrate to an etching atmosphere comprising a gaseous chloride precursor for removing the semiconductor layer over the second zone and leaving the mono-crystalline portion over the first zone.

11. The method according to claim 10, further comprising performing, between steps C) and D), a thermal treatment under an inert atmosphere whereby doping impurities from the passivation layer diffuse into the doped semiconductor layer.

12. The method according to claim 10, comprising performing steps B), C) and D) repeatedly.

13. The method according to claim 12, further comprising performing a thermal treatment under an inert atmosphere whereby doping impurities from the passivation layer diffuse into the doped semiconductor layer, the thermal treatment being performed between steps C) and D) of a last occurrence.

14. The method according to claim 10, wherein the mono-crystalline material is made of silicon and/or germanium.

15. The method according to claim 10, wherein the deposition atmosphere is devoid of any gaseous dopant precursors.

16. The method according to claim 10, wherein before step D), the mono-crystalline portion has a thickness of less than a few tens of nanometers.

17. The method according to claim 16, wherein the thickness is between 5 and 15 nm.

* * * * *